United States Patent [19]
Yuan et al.

[11] Patent Number: 5,214,298
[45] Date of Patent: May 25, 1993

[54] COMPLEMENTARY HETEROSTRUCTURE FIELD EFFECT TRANSISTORS

[75] Inventors: Han-Tzong Yuan, Dallas; Hisashi Shichijo, Garland; Hung-Dah Shih, Plano, all of Tex.

[73] Assignee: Texas Instruments Incorporated, Dallas, Tex.

[21] Appl. No.: 582,818

[22] Filed: Sep. 14, 1990

Related U.S. Application Data

[63] Continuation of Ser. No. 913,872, Sep. 30, 1986, abandoned.

[51] Int. Cl.$^5$ ............... H01L 29/161; H01L 27/02; H01L 21/225
[52] U.S. Cl. .................... 257/194; 257/195; 257/274; 257/279; 257/369; 437/160
[58] Field of Search .......... 357/42, 22, 16, 63, 357/90, 23.2; 437/160

[56] References Cited

U.S. PATENT DOCUMENTS 4,605,945 8/1986 Katayama ............... 357/22 A

FOREIGN PATENT DOCUMENTS 0165798 12/1985 European Pat. Off. .

OTHER PUBLICATIONS

IBM Technical Disclosure Bulletin by Tang vol. 27, #9, pp. 5064-5066 Feb. 1985.

*Primary Examiner*—Mark V. Prenty
*Attorney, Agent, or Firm*—Richard A. Stoltz; James C. Kesterson; Richard L. Donaldson

[57] ABSTRACT

Complementary heterostructure field effect transistors (30) with complementary devices having complementary gates (40, 50) and threshold adjusting dopings are disclosed. Preferred embodiment devices include a p+ gate (50) formed by diffusion of dopant to convert n+ gate material to p+, and a pulse-doped layer adjacent the two-dimensional carrier gas channels to adjust threshold voltages. Further preferred embodiments have the conductivity-type converted gate (50) containing a residual layer of unconverted n+ which cooperates with the pulse-doped layer threshold shifting to yield threshold voltages which are small and positive for n-channel and small and negative for p-channel devices.

7 Claims, 5 Drawing Sheets

COMPLEMENTARY HETEROSTRUCTURE FIELD EFFECT TRANSISTORS

This application is a continuation of application Ser. No. 06/913,872, filed Sep. 30, 1986 and now abandoned.

BACKGROUND OF THE INVENTION

1. Field of the Invention

The present invention relates to electronic semiconductor devices and integrated circuits, and, more particularly, to complementary field effect transistors with heterostructure insulated gates and integrated circuits including them and methods of fabrication.

2. Description of the Related Art

Very large scale integrated semiconductor memory and logic devices are being pushed for ever higher speed switching, lower power consumption, and larger noise margins. Thus there has been considerable effort to combine the intrinsic high switching speed and semiinsulating properties of gallium arsenide (GaAs) with the inherent large noise margins and low standby power dissipation of complementary field effect transistor (FET) logic. Complementary GaAs JFET circuits have shown very low standby power dissipation, but the low hole mobility of GaAs leads to low extrinsic transconductance of the p-channel devices and relatively low switching speeds; see, for example, R. Zuleg et al, 5 IEEE Elec. Dev. Lett. 21 (1984).

High hole mobilities have been obtained in modulation doped aluminum gallium arsenide/gallium arsenide ($Al_xGa_{1-x}As$/GaAs) heterojunction FETs which rely on a channel consisting of a two-dimensional hole gas at the heterojunction; see, for example, H. Störmer et al, 44 Appl. Phys. Lett. 1062 (1984). This is the complement of the modulation doped heterojunction FET which utilizes a two-dimensional electron gas (HEMT, MODFET, etc.). However, the threshold voltages of these modulation doped heterojunction devices depend critically on the thickness and doping concentration of the $Al_xGa_{1-x}As$ layer, and reported variations in HEMT threshold voltages across a two inch wafer typically have a standard variation in the range of 0.15 V to 0.4 V; see, K. Arai et al. 7 IEEE Elec. Dev. Lett. 158 (1986). Even the use of pulse doping of the $Al_xGa_{1-x}As$ (see. Hueschen et al, 1984 IEDM Tech. Digest 348) does not solve the problem. Consequently, heterostructure insulated gate FETs (HFETs), which use an undoped $Al_xGa_{1-x}As$ layer as a gate insulator in a MIS-like structure have appeared; see, P.Solomon et al, 5 IEEE Elec. Dev. Lett. 379 (1984). HFETs have the advantage of uniformity and reproducibility of threshold voltage because the threshold voltage is primarily determined by the gate material and is independent of the $Al_xGa_{1-x}As$ layer thickness.

Complementary HFET devices, using a two-dimensional electron gas for the n channel device and a two-dimensional hole gas for the p channel device, have been fabricated on a single undoped $Al_xGa_{1-x}As$/GaAs substrate: see N. Cirillo et al, 1985 IEDM Tech. Digest 317-320. Both the n and p channel devices use tungsten silicide (WSi is used to represent the various silicides of tungsten) Schottky barrier gates on the undoped $Al_xGa_{1-x}As$ and are relatively easy to fabricate. However, the threshold voltage for the WSi Schottky barrier gate is about 0.8-1.0 V for the n-channel device and about $-0.7--0.4$ V for the p-channel device; whereas, for 1 V power supply operation the n-channel threshold should be about 0.2-0.3 V and the p-channel threshold should be about $-0.3--0.2$ V.

In contrast, K. Matsumoto et al, 7 IEEE Elec. Dev. Lett. 182 (1986), have fabricated complementary HFET devices with $Al_xGa_{1-x}As$ as the insulator and n+ and p+ GaAs gates for the n and p channel devices, respectively. This yields low threshold voltages (about 0 V), but the fabrication requires a mesa etch and epitaxial refill.

In either case, the threshold voltage may be adjusted by uniformly doping the GaAs layer which would be analogous to the channel implants in MOSFET technology to adjust threshold voltage. However, to adjust the threshold voltage by 0.1 V would require a doping level of about $5 \times 10^{15}/cm^3$, which is too low to be reproducibly controlled by the growth techniques used to fabricate the basic heterostructure (i.e., by molecular beam epitaxy (MBE) or metalorganic chemical vapor deposition (MOCVD)).

Thus it is a problem to fabricate complementary HFET devices with desirable threshold voltages by a simple process.

SUMMARY OF THE INVENTION

The present invention provides complementary heterostructure insulated-gate field effect transistors (HFETs) and fabrication methods which have planar structure and adjustable threshold voltages. Preferred embodiments include gallium arsenide (GaAs) sources. drains, and channels with aluminum gallium arsenide ($Al_xGa_{1-x}As$) gate insulators and GaAs gates; the gates for the n-channel and p-channel HFETs are both formed from a common n+ layer of GaAs but the p-channel HFET has its gate converted to a p+ gate by diffusion of zinc from an overlying tungsten silicide zinc alloy. This provides a simple fabrication method for complementary HFETs with small threshold voltages which are reproducible because the n-channel threshold voltage is determined by the n+ GaAs layer doping level as grown and the p-channel threshold voltage is determined by the p+ doping level arising from the zinc diffusion and can be performed by precision rapid thermal annealing. And no mesa etches or epitaxial refill is needed plus the planar surface makes for easy interconnections.

Threshold voltages are adjusted by pulse doping of the GaAs channel away from the two-dimensional electron and hole gas channels. Such threshold adjustment uses high doping concentrations in thin layers to overcome the reproducibility limitations of low concentration uniform doping, and may also be used on single HFETs and Schottky gate HFETs.

BRIEF DESCRIPTION OF THE DRAWINGS

The drawings are schematic for clarity.

DESCRIPTION OF THE PREFERRED EMBODIMENTS

Figure 1:
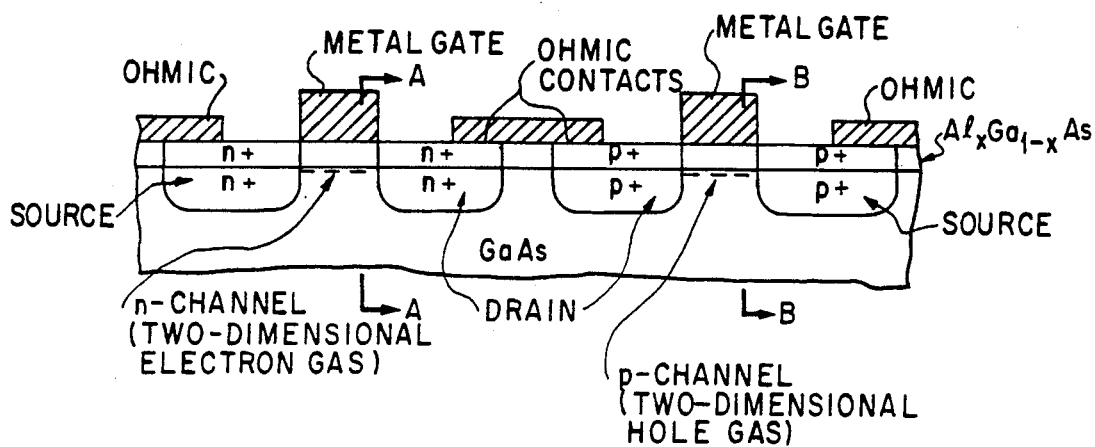
FIG. 1 illustrates in cross sectional elevation view a pair of complementary HFETs with connected drains.
Figures 2A, 2B:
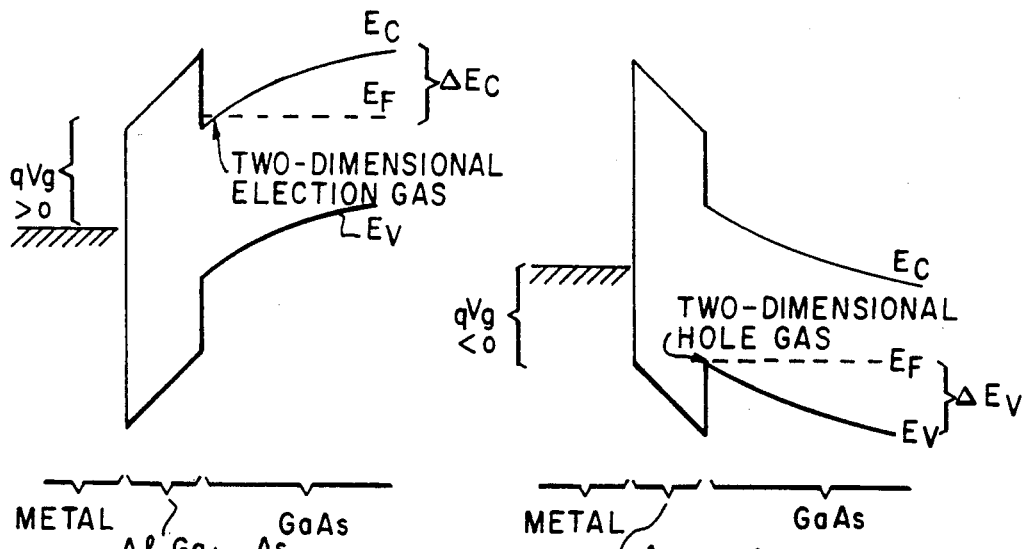
FIGS. 2A-B are energy band diagrams for the pair of FIG. 1.

FIG. 1 is a schematic cross sectional elevation view of a pair of complementary heterostructure insulated gate field effect transistors (HFETs) with the drain of the n-channel HFET (lefthand portion of FIG. 1) connected to the drain of the p-channel HFET (righthand portion of FIG. 1). The metal gates form Schottky barriers with the undoped $Al_xGa_{1-x}As$, and the two dimensional electron (hole) gas is created at the undoped $Al_xGa_{1-x}As$/GaAs interface by a positive (negative) voltage applied to the metal gate of the n-channel (p-channel) HFET. Of course, the gate voltage only bends the conduction and valence bands as shown in FIGS. 2A-B. and the electrons and holes to form the two-dimensional gasses are primarily supplied by the heavily doped regions. FIG. 2A is the band diagram along line A—A of FIG. 1, and FIG. 2B is the band diagram along line B—B of FIG. 1. The carrier density in the two-dimensional gasses is controlled by the magnitudes of the gate voltages $V_g$ which determine the depths of the potential wells at the heterojunctions, and source to drain current flows under applied bias analogous to current in complementary MOSFETs with the two-dimensional gasses the analogs of the inversion layers.

A first approximation for the threshold voltages of the HFETs (i.e., ignore the voltage drop across the $Al_xGa_{1-x}As$ and bend the GaAs conduction band edge down to the Fermi level) is:

$$V_{Tn} = +\phi_n - \Delta E_c/q$$

$$V_{Tp} = -\phi_p + \Delta E_v/q$$

where $V_{Tn}$ is the threshold voltage for the n-channel HFET, $V_{Tp}$ is the p-channel HFET threshold, $q\phi_n$ and $q\phi_p$ are the Schottky barrier heights for the n and p gates, respectively, and $\Delta E_c$ and $\Delta E_v$ are the discontinuities of the conduction and valence band edges at the heterojunction, respectively. Note that the GaAs and $Al_xGa_{1-x}As$ beneath the gates are undoped so the band edges have small curvature and the depletion charge in the $Al_xGa_{1-x}As$ is small. For WSi gates, $Al_xGa_{1-x}As$ with x=0.3, and the band edge discontinuity appearing 60% in the conduction band and 40% in the valence band, the threshold voltages should be about $V_{Tn}= +0.8$ V and $V_{Tp}= -0.7$ V. Note that with GaAs gates (n+ for the n-channel and p+ for the p-channel) the threshold voltages should be about $V_{Tn}=V_{Tp}=0$.

If the GaAs between the source and drain were uniformly doped to an acceptor concentration of $N_A$, then the threshold voltage would be raised by approximately $$\Delta V_T = d\sqrt{\frac{2q\phi_s N_A}{\epsilon}}$$

where d is the thickness of the $Al_xGa_{1-x}As$ gate insulator, $\phi_s$ is the surface potential, and $\epsilon$ is the permittivity of the GaAs. However, to reproducibly adjust the threshold voltages to within a 0.1 V range by doping the GaAs would require control of the doping concentration to within a range of about $\pm 2 \times 10^{15}/cm^3$, which is beyond MBE and MOCVD reproducibility.

Figure 3A:
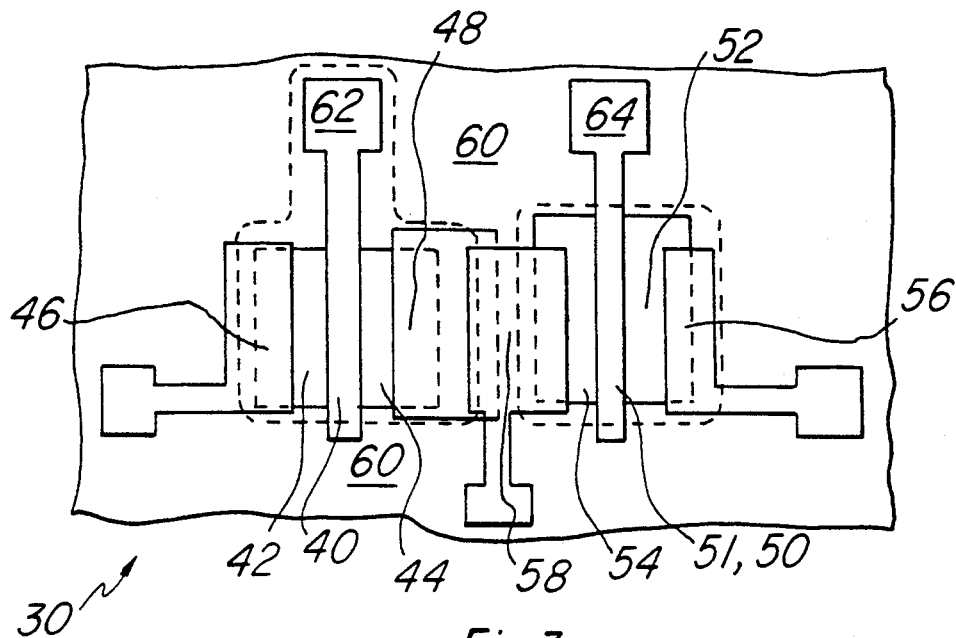
FIGS. 3A-B are plan and cross sectional elevation views of a first preferred embodiment pair of complementary HFETs.
Figure 3B:
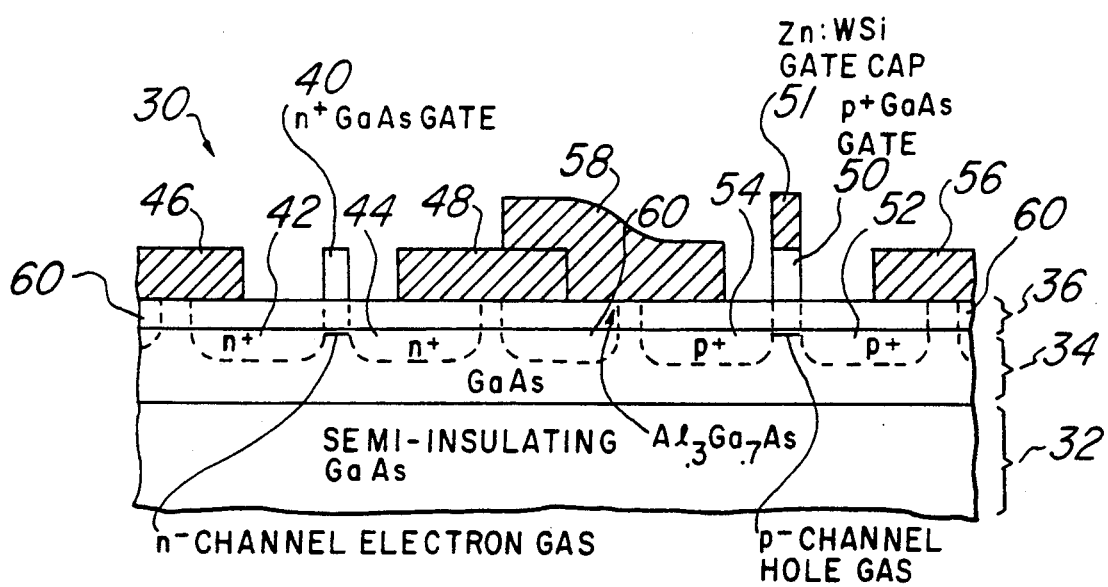
Figure 4A:
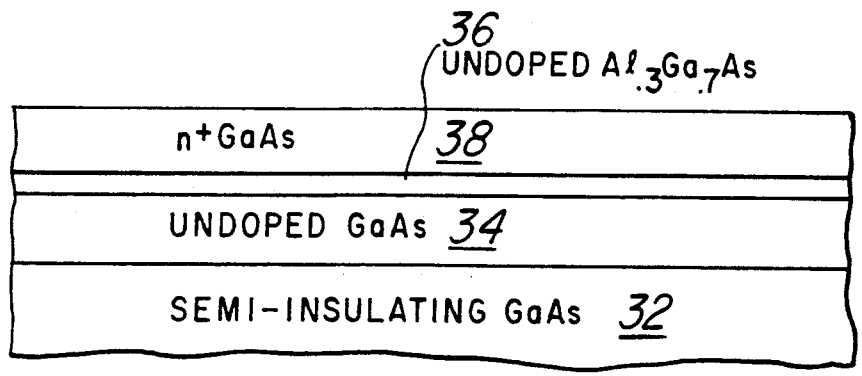
FIGS. 4A-D illustrate a first preferred embodiment method of fabrication of the pair of FIGS. 3A-B.
Figure 4B:
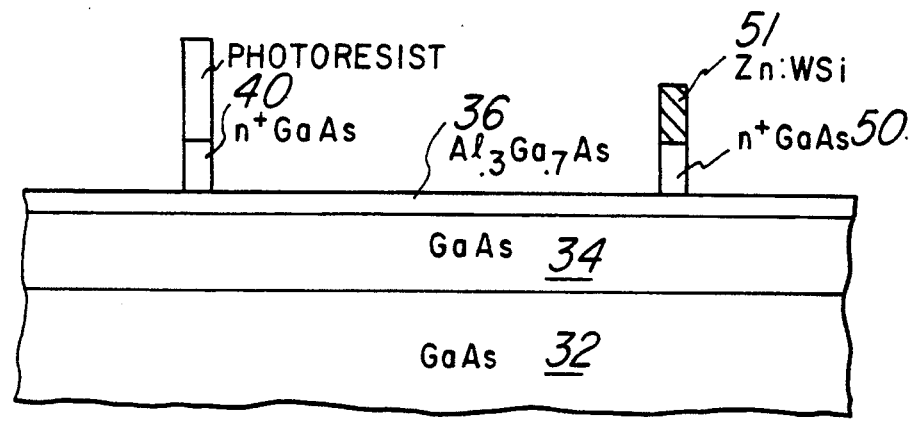
Figure 4C:
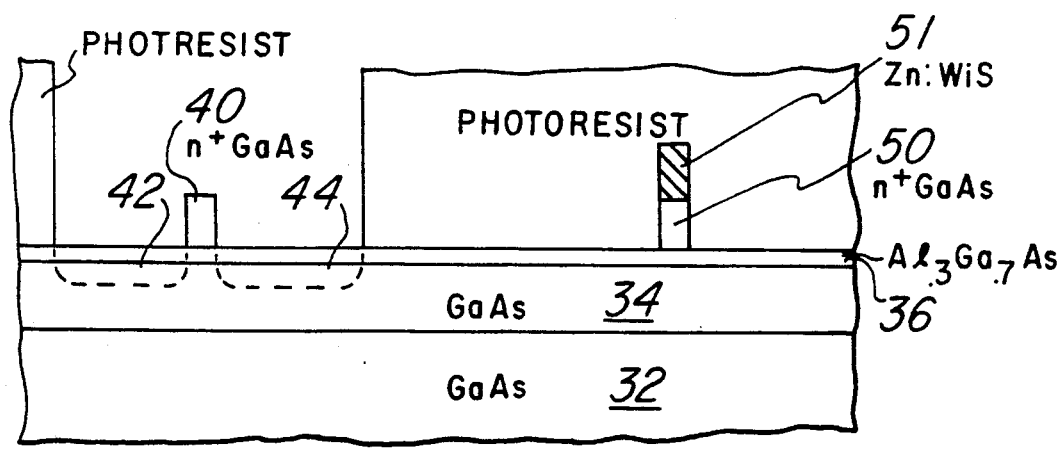
Figure 4D:
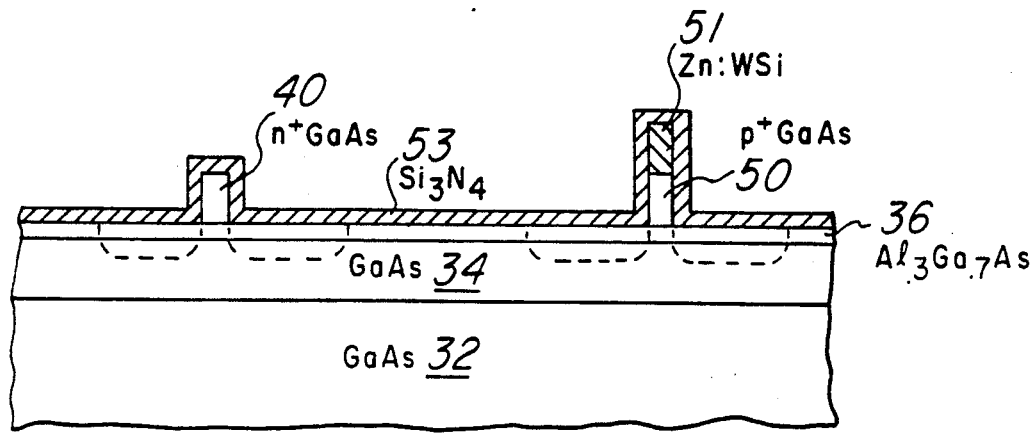

A first preferred embodiment pair of complementary HFETs, generally denoted 30, is illustrated schematically in plan and cross sectional elevation views in FIGS. 3A-B and includes semi-insulating GaAs 32; GaAs buffer epilayer 34 of thickness 1 μm and of various dopings: n+ in regions 42 and 44, p+ in regions 52 and 54, and undoped in the remainder; $Al_xGa_{1-x}As$ with x=0.3 epilayer 36 of thickness 0.05 μm and of various dopings: n+ in regions 42 and 44, p+ in regions 52 and 54, and undoped in the remainder; n+ GaAs gate 40 and pad 62 of thickness 0.5 μm; p+ gate 50 and pad 64 of thickness 0.5 μm; ohmic contacts 46, 48, 56, and 58; and WSi:Zn gate cap 51. Epilayers 34 and 36 have been boron bombarded in regions 60 to convert the GaAs and $Al_xGa_{1-x}As$ to high resistivity material by lattice damage; this high resistivity material provides isolation of the n and p channel HFETs from each other and from other adjacent devices. Passivation layers and packaging are not shown for clarity. The n-channel HFET has region 42 in layers 34 and 36 as its source, region 44 in layers 34 and 36 as its drain, gate 40 as its gate which has a length (right-to-left in FIGS. 3A-B) of 1 μm and a width (top-to-bottom in FIGS. 3A-B) of 8 μm, and an undoped portion of layer 36 as its gate insulator; and the p-channel HFET has region 52 in layers 34 and 36 as its source, regions 54 in layers 34 and 36 as its drain, gate 50 as its gate which has a length (right-to-left in FIGS. 3A-B) of 1 μm and a width (top-to-bottom in FIGS. 3A-B) of 8 μm, and an undoped portion of layer 36 as its gate insulator. Thus the n-channel HFET has an n+ GaAs gate and the p-channel HFET has a p+ GaAs gate; so the threshold voltages to first approximation are both about 0 V.

Gate cap 51 also covers pad 64. Note that gate cap 51 could be removed without affecting the operation of pair 30; conversely, gate 40 could have a gate cap of material such as WSi. Such gate caps keep the resistance of the gates low, and with wider gates or thinner gates such gate caps are preferred. The two-dimensional electron and hole gas channels are formed in layer 34 at the interface with layer 36 as illustrated in FIG. 3B. The heavy doping in sources and drains 42, 44, 52, and 54 implies that the heterojunction between layers 34 and 36 has sharp band bending and provides only a minimal tunneling barrier for majority carriers from layer 34 to the ohmic contacts; further, the alloying formation of ohmic contacts 46, 48, 56, and 58 leads to diffusion of contact metal through layer 36 and into layer 34 which additionally limits the heterojunction barrier of layer 36.

The operation and characteristics of HFETs 30 can be further understood in connection with the following first preferred embodiment method of fabrication as illustrated in cross sectional elevation views in FIGS. 4A-D:

(a) Start with a undoped semi-insulating GaAs substrate 32 which has a planar (100) oriented surface, and grow by molecular beam epitaxy (MBE) a layer 34 of undoped (p−) GaAs to a thickness of 1 μm followed by a layer 36 of undoped (p−) $Al_xGa_{1-x}As$ with x=0.3 to a thickness of 0.05 μm and lastly a layer 38 of n+ Si-doped GaAs to a thickness of 0.5 μm. See FIG. 4A for a schematic illustration of the layered structure. The Si concentration in layer 38 is $1 \times 10^{18}/cm^3$, it is difficult to grow layers with much higher doping levels; and the p− residual carrier concentration in undoped layers 34 and 36 is typically about $1 \times 10^{14}/cm^3$ and arises from residual carbon doping.

(b) Zinc and $W_5Si_3$ are cosputter deposited on the layered structure to a thickness of 0.3 μm and a composition of 10% zinc: the deposited layer sticks well to GaAs. Then the deposited metal layer is photolithographically patterned and etched by $CF_4/O_2$ reactive ion etching (RIE) to form gate cap 51 to locate gate 50 and pad 64 of the p-channel HFET. Next photoresist is spun onto the layered structure and gate cap 51 and photolithographically patterned to define the location of gate 40 and pad 62 of the n-channel HFET. The patterned photoresist and gate cap 51 are then used as a mask to selective plasma etch layer 38 to define gate 40, pad 62, gate 50, and pad 64: the selective etch of layer 38 can be a mixture of $H_2O_2$ and $NH_4OH$ which rapidly etches GaAs but is inhibited on $Al_xGa_{1-x}As$. Note that a slight overetch that removes a portion of the $Al_xGa_{1-x}As$ will not affect the heterointerface where the two-dimensional electron gas will be located. See FIG. 4B.

(c) Photoresist is again spun on and patterned to define a mask for implanting source 42 and drain 44 of the n-channel HFET; gate 40 will also be part of the implant mask and is thicker than the range of the implant, so the portion of $Al_xGa_{1-x}As$ layer 36 below gate 40 will remain undoped. Then Si is implanted at 60 keV with a dose of $5 \times 10^{13}/cm^2$ to form source 42 and drain 44. Note that the source 42 and drain 44 are self-aligned to gate 40 and the implanted Si will be activated by a later rapid thermal anneal. See FIG. 4C which illustrates the extent of the Si implant by dashed lines; the peak of the implant is at depth of about 0.05 μm which is at the heterointerface of layers 34 and 36.

(d) The existing photoresist is ashed and new photoresist is spun on and photolithographically patterned to define a mask for implanting source 52 and drain 54 of the p-channel HFET; gate cap 51 and gate 50 are also used as part of the mask. Then Be is implanted at 50 keV with a dose of $3 \times 10^{13}/cm^2$ to form source 52 and drain 54. The photoresist is ashed and silicon nitride cap 53 of 0.1 μm thickness is deposited by LPCVD. A rapid thermal anneal at 750° C. for 13 seconds with silicon nitride cap both activates the Si and Be implants and diffuses zinc out of gate cap 51 and through gate 50 to about $Al_xGa_{1-x}As$ layer 36. The zinc diffusion converts gate 50 from n+ to p+. Note that the activation of the implants is not as time critical as the zinc diffusion, so the rapid thermal anneal time is selected to have the zinc diffusion stop just at the interface of layers 36 and 38. Zinc diffuses in GaAs interstitially and follows a $D \propto N^2$ law where D is the diffusion constant and N is the zinc concentration; the $N^2$ dependence arises from the charge state change of two in the dissociation reaction (zinc on a Ga site to zinc in an interstitial site). The $D \propto N^2$ law implies the zinc diffuses in GaAs with a concentration profile that is roughly constant from the zinc source to an abrupt diffusion front; and the distance the front has progressed after a time t is proportional to $\sqrt{t}$. The roughly constant concentration is about $1 \times 10^{20}/cm^3$; this is much greater than the Si concentration of $1 \times 10^{18}/cm^3$ in layer 38 and easily converts it to p+. See FIG. 4D which illustrates the conversion of gate 50 to p+ and the extent of the Be implant by dashed lines; the peak of the implant is at depth of about 0.05 μm which conincides with the heterointerface of layers 34 and 36.

(e) The silicon nitride cap 53 is removed and device isolation is defined photolithographically and formed by boron implantation 60 which disrupts the crystal lattice and thereby raises the resistivity. Note that the boron does not penetrate gate cap 51 and is masked away from gate 40, so the boron does not affect the resistivity of gates 40 and 50. Then, metal contacts and interconnections are formed by photolithographic patterning, metal evaporation, and liftoff; ohmic contacts 46 and 48 to n regions are alloyed Ni/Ge/Au and ohmic contacts 56 and 58 to p regions are alloyed Au/Zn/Au. These steps are all low temperature procedures and do not cause further diffusion of the zinc in gate 50. See FIG. 3B for the completed pair 30 of complementary HFETs with their drains 44 and 54 connected. Passivation and interconnection insulation layers such as silicon nitride are not shown for clarity.

Note that if in step (d) the zinc diffusion front were about 0.05 μm short of reaching layer 36, then there would be a residual n− layer about 0.05 μm thick and abutting gate insulator $Al_xGa_{1-x}As$ 36. This n+ layer would not fully deplete (the Debye length is about 40 Å at this doping level, and the depletion layer is about ten Debye lengths thick at room temperature) and would cause enough band bending to decrease $V_{Tp}$ by about the bandgap of GaAs (roughly, $V_{Tp}$ decreases from about 0 V to about −1.4 V). In more detail and with an approximation of the zinc diffusion front as sharp and located 500 Å from the $Al_xGa_{1-x}As$. at the p+/n+ interface the p+ will be depleted to a depth of 4 Å and the n+ to a depth of 400 Å. and at the n+/p− interface the n+ will be depleted to a depth of 4 Å and the p− to a depth of 4. μm (the thickness of the $Al_xGa_{1-x}As$ is negligible compared to the depletion depth in the undoped GaAs and has been ignored). Thus the effect of the zinc diffusion front being short of the $Al_xGa_{1-x}As$ by at least 400 Å is to have a threshold voltage for the p-channel as if there were an n+ GaAs gate. Similarly, if the zinc diffusion front extended into $Al_xGa_{1-x}As$ layer 136, then $V_{Tp}$ would be increased and a depletion-mode device may result. Of course, the valence band discontinuity at the heterointerface is much less than the bandgap of GaAs (it is about 0.3 eV for $Al_xGa_{1-x}As$ with x=0.3), so $V_{Tp}$ will not increase beyond about +0.3 V. The zinc diffusion front must be controlled to within less than 50 Å, which is about 1% of the total diffusion distance. Note that the rapid thermal anneal to diffuse the zinc may be carried out in more than one step at more than one temperature. For example, an initial diffusion for 12 seconds at 750° C. can be performed and the resulting threshold voltages probed; then a short secondary diffusion at 675° C. can bring the threshold voltage to the desired level.

Use of a thinner GaAs layer to form gates 40 and 50 permits more accurate control of the zinc diffusion, and the resistivity of the gates can be kept low by WSi caps. In particular, if layer 38 were only 0.1 μm thick and if the photoresist in step (b) were used instead to liftoff a gate cap that defined gate 40, then the zinc diffusion of step (d) controlled to within 1% would give a ±10 Å location of the zinc front.

Figure 5:
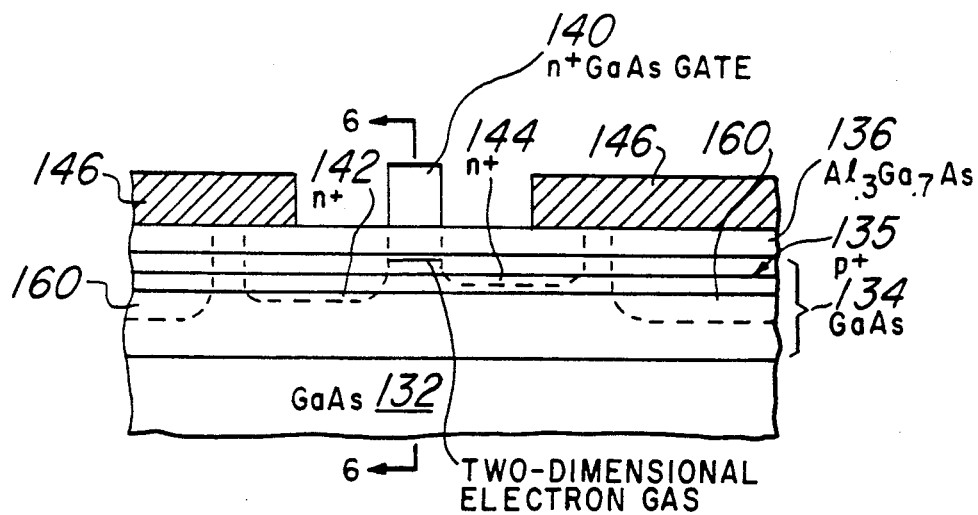
FIG. 5 is a cross sectional elevation view of a second preferred embodiment HFET.

A second preferred embodiment HFET, generally denoted 130, is schematically shown in cross sectional elevation view in FIG. 5, and includes semi-insulating GaAs 132; GaAs buffer layer 134 of thickness 1 μm and of various dopings: n+ in regions 142 and 144, p in the portion of sublayer 135 not in regions 142 and 144, and undoped in the remainder; $Al_xGa_{1-x}As$ with x=0.3 layer 136 of thickness 0.05 μm and of two dopings: n+ in regions 142 and 144 and undoped in the remainder; n+ GaAs layer 138 of thickness 0.5 μm which has been etched away to form gate 140; and ohmic contacts 146 and 148. Proton bombardment in regions 160 of layers 134 and 136 convert them to high resistivity for isolation.

Figure 6:
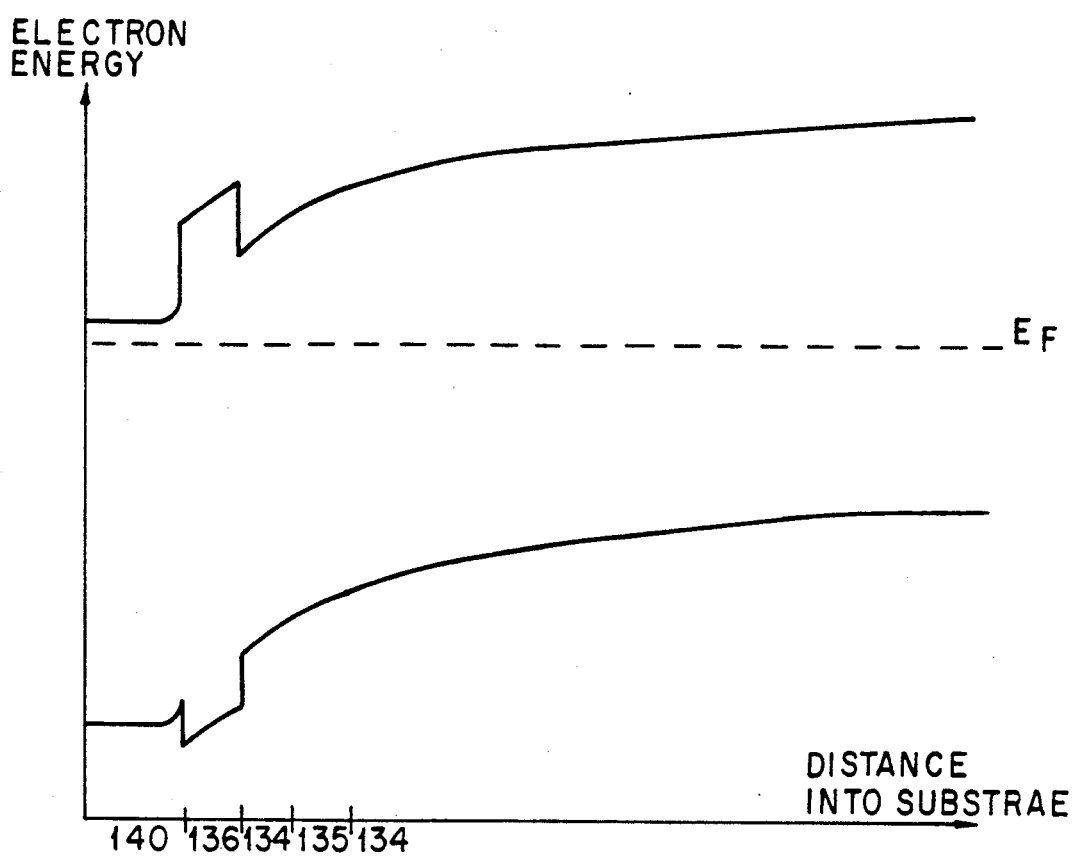
FIG. 6 is a energy band diagram for the second preferred embodiment HFET.

As with HFETs 30, the portion of n+ GaAs layer 138 between self-aligned regions 142 and 144 forms gate 140 of HFET 130 and has length 1.0 μm. Regions 142 and 144 form the source and drain of HFET 130, and the undoped portion of layer 136 beneath gate 140 forms the gate insulator. The conduction channel is a two-dimensional electron gas formed in layer 134 at the heterojunction with layer 136 and between regions 142 and 144; the p doped sublayer 135 increases the threshold voltage of HFET 130 as follows:

$$\Delta V_T = \frac{qN_A w'}{2\epsilon}$$

where w' is the thickness of sublayer 135 and $N_A$ is the acceptor concentration in sublayer 135. Thus with w'=500 Å and $N_A=5.5\times 10^{17}/cm^3$, $\Delta V_T=0.1$ V. Of course, sublayer 135 must be within the depletion region of layer 134 to affect the threshold voltage, but with a residual doping of less than $10^{15}/cm^3$ for the nominally undoped layer 134, this means that sublayer 135 could be in the order of 1,000 Å from the heterojunction. Also, the depletion of sublayer 135 prevents the sublayer from forming a short circuit from source to drain even if the sublayer were n doped (to lower the threshold). Sublayer 135 should not be closer than about 100 Å to the two-dimensional electron gas to avoid scattering of electrons in the gas. Doping sublayer 135 to $N_A=5.5\times 10^{17}/cm^3$ during an MBE or MOCVD growth of layer 134 is routine. See FIG. 6 for a schematic band diagram for HFET 130 along line 6—6 of FIG. 5. The portions of the bands corresponding to the various layers of HFET 130 are referenced along the horizontal axis with the corresponding layer reference numeral; note that the change in curvature of the bands due to sublayer 135 is difficult perceive in FIG. 6.

HFET 130 can be fabricated with the method of fabrication of HFETs 130 with the extra step of providing dopant during a portion of the growth of the GaAs buffer layer.

The pulse doping to adjust threshold voltage is also useful for Schottky barrier gate HFET, although a threshold change of perhaps 0.4 V may be needed which would be a 1,000 Å thick sublayer in the above example.

For complementary HFETs a p-doped sublayer in the GaAs layer will algebraically increase the threshold voltages for both the n-channel and p-channel HFETs (and an n-doped sublayer will decrease both), so with mixed gate material the p-doped sublayer may bring both threshold voltages to desired levels. For example, with an n+ GaAs gate for an n-channel HFET and a WSi gate for a p-channel HFET, the threshold voltages would be about $V_{Tn}=0$ V. and $V_{Tp}=-0.7$ V; and with sufficient p doping to lift the thresholds about 0.35 V, the thresholds would be about $V_{Tn}=+0.35$ V and $V_{Tp}=-0.35$ V. A further example: if the duffusion of zinc in step (d) for pair 30 does not reach the heterointerface and makes $V_{Tp}$ about $-0.5$ V, then a p pulse doping to raise thresholds by about 0.25 V will bring the thresholds up to ideal: $+0.25$ V for n-channel and $-0.25$ V for p-channel.

If in pair 30 the gates 40 and 50 were made of $Al_xGa_{1-x}As$ with x=0.1, then $V_{Tn}$ would become negative, $V_{Tp}$ positive, and the HFETs would be depletion mode devices. Conversely, if in pair 30 the buffer layer 34 were $Al_xGa_{1-x}As$ with x=0.1, then $V_{Tn}$ would be about $+0.1$ V and $V_{Tp}$ would about $-0.1$ V.

MODIFICATIONS AND ADVANTAGES

Various modifications of the preferred embodiment devices and methods may be made while retaining the threshold adjustment features of a pulse doped layer near a two-dimensional gas channel and of a conductivity type-changing diffusion forming a gate from a common layer of material forming the other conductivity type gates in a complementary device arrangement. Some examples: the dimensions and shapes of the devices could be varied such as the source and drain of each HFET forming an interdigited pattern with portions connected by air bridges and with gate widths of thousands of microns; the materials could be varied such as the substrate being epitaxial GaAs grown on silicon or such as other III-V or II-VI compounds (binary, ternary, or quarternary) grown on strained layer superlattices or germanium on silicon; the dopant rapidly diffusing out of the capping layer could be magnesium diffusing out of a mixture of MgO (20% by weight) and silicon dioxide which is deposited by sputtering: circuits of various complexity can be monolithically integrated using HFETs with the pulse doping or conductivity type-changing diffusion; the pulse doping can be of differing dopants in multiple sublayers; and the gate caps could be metals such as molybdenum, tungsten, and titanium or alloys of silicides.

The advantages of the threshold adjustments of the present invention include the control and reproducibility of pulse doping during growth of epilayers and the simplicity of gate conductivity-type conversion for complementary devices so both type gates can be formed from a common layer.

What is claimed is:
1. Complementary heterostructure field effect transistors, comprising:
   (a) a channel layer of a first semiconductor material;
   (b) an insulator layer of a second semiconductor material, said insulator layer abutting said channel layer and the bandgap of said second material larger than the bandgap of said first material;
   (c) at least one n-channel gate on said insulator layer, said at least one n-channel gate made of a third semiconductor material and doped n+;
   (d) at least one p-channel gate on said insulator layer, said at least one p-channel gate made of said third semiconductor material and p-doped by outdiffusion, said p+ doping characterized by a doping profile of diffusion of p dopants through said at least one p-channel gate which was previously n+ uniformly doped, said diffusion of sufficient dopant concentration to convert said n+ uniform doping to p+ doping in all but a residual layer adjacent said insulator layer;
   (e) n type source and drain regions in said insulator and channel layers adjacent said at least one n-channel gate;
   (f) p type source and drain regions in said insulator and channel layers adjacent said at least one p-channel gate; and
   (g) electrodes contacting said gates, said source regions and said drain regions.

2. The transistors of claim 1, wherein:
(a) said first and third materials are GaAs;
(b) said second material is $Al_xGa_{1-x}As$ where x is about 0.3;
(c) said p dopants are zinc; and
(d) said residual layer is n-doped.

3. The transistors of claim 2, wherein:
(a) said channel layer is substantially undoped except for a sublayer of substantially uniform doping and located adjacent but not abutting said insulator layer.

4. The transistors of claim 1, wherein:
(a) said channel layer is substantially undoped except for a sublayer of substantially uniform doping and located adjacent but not abutting said insulator layer.

5. The transistors of claim 1 wherein said residual layer is less than 5,000 Angstroms thick.

6. A method for fabricating a device containing complementary heterostructure field effect transistors comprising the steps of:
(a) forming a layered semiconductor structure with a first layer of a first semiconductor material having a depletion region and a second layer of second semiconductor material abutting said first layer and characterized by (i) the bandgap of said first semiconductor material being smaller than the bandgap of said second semiconductor material, (ii) said second layer being substantially undoped, and (iii) said first layer being substantially undoped except for a sublayer which is substantially uniformly doped a first conductivity type, said sublayer being within the depletion region of said first layer to provide a threshold voltage adjustment for transistors of first and second conductivity types;
(b) forming a first gate on said second layer;
(c) forming source and drain regions of a first conductivity type in said first and second layers adjacent said first gate extending above and below said sublayer and surrounded by said sublayer;
(d) forming a second gate on said second layer;
(e) forming source and drain regions of a second conductivity type in said first and second layers adjacent said second gate extending above and below said sublayer and surrounded by said sublayer; and
(f) forming electrodes to contact said gates, said source regions and said drain regions.

7. A complementary heterostructure field effect transistor structure, comprising:
(a) a channel layer of a first semiconductor material having a depletion layer;
(b) an insulator layer of a second semiconductor material, said insulator layer abutting said channel layer and the bandgap of said second semiconductor material larger than the bandgap of said first semiconductor material;
(c) a first gate on said insulator layer, said first gate made of a third semiconductor material;
(d) source and drain regions of a first conductivity type in said insulator layer adjacent said first gate;
(e) a second gate on said insulator layer, said second gate made of the third semiconductor material;
(f) source and drain regions of second conductivity type in said insulator layer adjacent said second gate,
(g) portions of said channel layer adjacent said gates substantially undoped except for a sublayer of substantially uniform doping, located adjacent but not abutting said insulator layer, said sublayer being within the depletion region of said channel layer; and
(h) electrodes contacting said gates, said source regions and said drain regions;
(i) each of said source regions and each of said drain regions extending above and below said sublayer and is surrounded by said sublayer.

* * * * *